United States Patent
Inagaki et al.

(10) Patent No.: US 9,411,229 B2
(45) Date of Patent: Aug. 9, 2016

(54) NEGATIVE PHOTOSENSITIVE RESIN COMPOSITION AND CURED PRODUCT OF SAME

(75) Inventors: Shinya Inagaki, Tokyo (JP); Nao Honda, Tokyo (JP); Naoko Imaizumi, Tokyo (JP); Misato Oonishi, Tokyo (JP)

(73) Assignee: Nippon Kayaku Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/124,474

(22) PCT Filed: Jun. 19, 2012

(86) PCT No.: PCT/JP2012/065567
§ 371 (c)(1),
(2), (4) Date: Dec. 6, 2013

(87) PCT Pub. No.: WO2012/176750
PCT Pub. Date: Dec. 27, 2012

(65) Prior Publication Data
US 2014/0099581 A1  Apr. 10, 2014

(30) Foreign Application Priority Data
Jun. 20, 2011  (JP) ................................. 2011-136179

(51) Int. Cl.
| | | |
|---|---|---|
| G03F 7/038 | (2006.01) | |
| C08G 59/06 | (2006.01) | |
| C08G 59/32 | (2006.01) | |
| C08G 59/42 | (2006.01) | |
| C08L 63/00 | (2006.01) | |

(52) U.S. Cl.
CPC ............ *G03F 7/0382* (2013.01); *C08G 59/063* (2013.01); *C08G 59/3218* (2013.01); *C08G 59/42* (2013.01); *C08L 63/00* (2013.01); *G03F 7/038* (2013.01)

(58) Field of Classification Search
None
See application file for complete search history.

(56) References Cited

U.S. PATENT DOCUMENTS

| | | |
|---|---|---|
| 4,882,245 A | 11/1989 | Gelorme et al. |
| 2005/0147918 A1 | 7/2005 | Weber et al. |
| 2015/0024326 A1* | 1/2015 | Nawrocki ............. G03F 7/0045 430/280.1 |

FOREIGN PATENT DOCUMENTS

| | | |
|---|---|---|
| CN | 1914561 A | 2/2007 |
| CN | 101717599 A | 6/2010 |
| JP | 6-25582 A | 2/1994 |
| JP | 10-97068 A | 4/1998 |
| JP | 2000-143770 A | 5/2000 |
| JP | 3698499 B2 | 9/2005 |
| JP | 2008-26667 A | 2/2008 |
| JP | 2009-75261 A | 4/2009 |
| JP | 2009216790 A | 9/2009 |
| JP | 2010-265408 A | 11/2010 |
| JP | 2011-81302 A | 4/2011 |
| JP | 2011-256271 A | 12/2011 |
| WO | WO 2013/134104 A2 * | 9/2013 |

OTHER PUBLICATIONS

CAS Registry No. 125370-98-1, down loaded from SCifinder database on Jun. 10, 2014, 2 pages.*
International Search Report/Written Opinion mailed Jul. 17, 2012 in corresponding PCT application No. PCT/JP2012/065567.
International Preliminary Report on Patentability mailed Jan. 9, 2014 in corresponding PCT application No. PCT/JP2012/065567.
Micromachine, published by Sangyo Gijutsu Service Center Co., Ltd. (2002), 26 pages.
Kobunshi (Polymers), vol. 43, p. 564-569 (1994), Sotobayashi.
Chinese communication, with English translation, dated Oct. 10, 2015 in corresponding Chinese patent application No. 201280030558.3.
Chinese communication, with English translation, dated May 5, 2016 in corresponding Chinese patent application No. 201280030558.3.

* cited by examiner

*Primary Examiner* — Cynthia Hamilton
(74) *Attorney, Agent, or Firm* — Nields, Lemack & Frame, LLC

(57) ABSTRACT

A negative photosensitive resin composition which contains (A) an epoxy resin that has two or more epoxy groups in each molecule, (B) an alkali-soluble resin and (C) a cationic photopolymerization initiator. The epoxy resin (A) is an epoxy resin that is obtained by a reaction between a phenol derivative represented by formula (1) and an epihalohydrin.

(1)

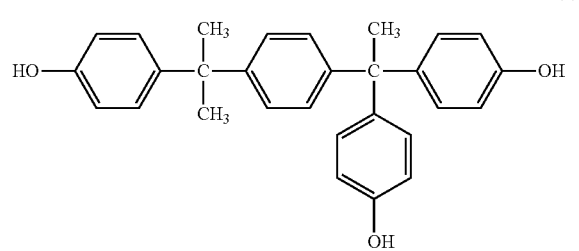

6 Claims, No Drawings

NEGATIVE PHOTOSENSITIVE RESIN COMPOSITION AND CURED PRODUCT OF SAME

TECHNICAL FIELD

The present invention relates to a negative resist. The present invention relates particularly to a negative photosensitive resin composition suitable for precision processing including bump formation, metal post formation, and interconnect formation carried out in production of MEMS components, micromachine components, electronic components, μ-TAS (micro-total analysis system) components, microreactor components, and the like, and for production of displays including LCDs, PDPs, electronic papers, and organic ELs.

BACKGROUND ART

MEMS (microelectromechanical systems) or micromachines are devices in which micromachine elements, electronic circuits, and optical devices are integrated, and are studied for many applications and used practically (see Non Patent Literature 1). Since these devices, though being small-size components based on semiconductor production technologies, execute complicate and advanced functions, the devices are used as important components holding the key to microsystems including various types of sensors, printer heads, disk heads, optical switches for communication, and biochips. Devices in these fields, unlike usual semiconductor production, necessitate resists capable of being patterned in a high aspect ratio (which means "a height of a structure/a width thereof").

A production method of structures having a high aspect ratio often employs a pattern formation process using X-ray lithography of a photosensitive resin composition, referred to as a "LIGA process" (see Non Patent Literature 2). However, the LIGA process has drawbacks including necessitating a high-priced X-ray apparatus and necessitating long-time X-ray irradiation. Due to demands including resource saving, energy saving, workability improvement, and productivity improvement, applications of inexpensive high-productivity UV (ultraviolet rays) lithographic systems are paid attention to.

However, positive resists based on the dinaphthoquinone-novolac reaction in UV lithographic systems are not suitable for applications requiring a film thickness of 50 μm or more. That film thickening has such a limitation is because dinaphthoquinone-type (DNQ) photoreaction products exhibit relatively high light absorption at near-ultraviolet wavelengths (350 to 450 nm) generally used for resist exposure. Sidewalls peculiar to DNQ-type photoresists assume not a straight shape but rather a slope shape due to the difference in solubility between the exposure region and the non-exposure region in a developing liquid. Furthermore, the irradiation intensity at the bottom portion of a resist is known to be lower than that at the surface because the resist itself absorbs irradiated light, and in the case where the light absorption capability of a resist itself is extremely high, underexposure of the bottom portion becomes remarkable, and the sidewalls assume a slope shape or a distorted shape.

Patent Literature 1 describes that a negative chemically-amplified thick-film resist composition composed of a propylene carbonate solution of a polyfunctional bisphenol A novolac epoxy resin, a photoacid generating agent, and an aromatic sulfonium hexafluoroantimonate exhibits a very low light absorption in the wavelength region of 350 to 450 nm. The resist composition is applied on various types of substrates by spin coating, curtain coating, or the like, thereafter baked to volatilize the solvent to thereby form a solid photoresist layer having a thickness of 100 μm or more, and further irradiated with near-ultraviolet light through a photomask by using one of various types of exposure methods such as contact exposure, proximity exposure, and projection exposure to be thereby subjected to a photolithographic processing. Then, the resultant is immersed in a developing liquid to thereby dissolve the non-exposure region, whereby high-resolution negative images of the photomask can be formed on the substrates. The Patent Literature also discloses similar means for such an application as a dry film resist coated on a base material such as a polyester film. However, the development of the composition uses an organic solvent. Because organic solvents can affect the environment and for other reasons, resists forming high-aspect ratio structures capable of being developed with an alkali have been demanded. Patent Literatures 2, 3 and 4 each disclose resist compositions capable of being developed with an alkali aqueous solution as chemically amplified thick-film resists. However, because the compositions cause coloration by heat and yellowing with time, the compositions cannot be used in the fields requiring transparency.

On the other hand, Patent Literature 5 discloses a resin composition for optical three-dimensional shaping containing a specific epoxy compound as a resin composition excellent in transparency. However, because the resin composition cannot be developed with an alkali aqueous solution, fine patterns cannot be formed by photolithography using existing lines for semiconductors, LCDs, MEMSs, and the like.

In recent years, in fields requiring transparency, including displays such as LCDs, partition walls for electronic papers and organic ELs, and the like, resists providing structures capable of being developed with an alkali and having a high aspect ratio and transparency have been demanded, but no resists satisfying all the properties have been found.

CITATION LIST

Patent Literature

Patent Literature 1: U.S. Pat. No. 4,882,245 B
Patent Literature 2: JP 3698499 B
Patent Literature 3: US 2005/0,147,918 A
Patent Literature 4: JP 10-97068 A
Patent Literature 5: JP 2010-265408 A

Non Patent Literature

Non Patent Literature 1: Micromachine, published by Sangyo Gijutsu Service Center Co., Ltd. (2002) (in Japanese)
Non Patent Literature 2: Kobunshi, vol. 43, p. 564 (1994) (in Japanese)

SUMMARY OF INVENTION

Technical Problem

It is an object of the present invention to provide a negative resin composition which can be developed with an alkali in high resolution and high sensitivity and which can provide a cured product having high transparency and heat resistance, exhibiting little yellowing coloring by heat, and having a high aspect ratio.

Solution to Problem

As a result of exhaustive studies to solve the above-mentioned problems, the present inventors have found that the use of a negative photosensitive resin composition in a combination of a specific epoxy resin, an alkali-soluble resin, and a photocationic polymerization initiator can solve the above-mentioned problems, and this finding has led to the completion of the present invention.

That is, the present invention relates to the following aspects.

(1) A negative photosensitive resin composition containing an epoxy resin (A) having two or more epoxy groups in one molecule thereof, an alkali-soluble resin (B), and a photocationic polymerization initiator (C), wherein the epoxy resin (A) is obtained by a reaction of a phenol derivative represented by the following formula (1):

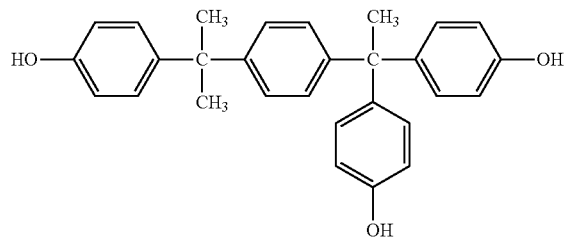

(1)

with an epihalohydrin;
(2) The negative photosensitive resin composition according to the above (1), wherein the alkali-soluble resin (B) is an alkali-soluble resin having one or more carboxyl groups in one molecule thereof.
(3) The negative photosensitive resin composition according to the above (2), wherein the alkali-soluble resin (B) is a resin obtained by reacting an epoxy resin (a) with a monocarboxylic acid (b) so as to prepare a reaction product; and then subjecting the reaction product to a further reaction with a polybasic acid or an anhydride thereof (c).
(4) A cured product, being obtained by curing a negative photosensitive resin composition according to any one of the above (1) to (3).

Advantageous Effects of Invention

The negative photosensitive resin composition which can be developed with an alkali according to the present invention has features that the resin composition has high sensitivity and high resolution, and that a cured product of the resin composition maintains high transparency, and has good heat resistance and exhibits little coloration by heat.

DESCRIPTION OF EMBODIMENTS

Hereinafter, embodiments according to the present invention will be described in detail.

The negative photosensitive resin composition according to the present invention (hereinafter, also referred to simply as "the resin composition according to the present invention") comprises an epoxy resin (A) (hereinafter, also referred to simply as "component (A)") having two or more epoxy groups in one molecule thereof and obtained by a reaction of a phenol derivative represented by the above formula (1) with an epihalohydrin, an alkali-soluble resin (B) (hereinafter, also referred to simply as "component (B)"), and a photocationic polymerization initiator (C) (hereinafter, also referred to simply as "component (C)").

The component (A) contained in the negative photosensitive resin composition according to the present invention can be obtained by a conventionally known synthesis method of epoxy resins by using a phenol derivative represented by the formula (1) and an epihalohydrin.

Examples of such general synthesis methods include a method in which: an alkali such as sodium hydroxide is added to a mixed solution obtained by dissolving a phenol derivative represented by the formula (1) and an epihalohydrin (epichlorohydrin, epibromohydrin, or the like) in a solvent, and heated to a reaction temperature to be thereby subjected to an addition reaction and a ring-closing reaction; thereafter, the reaction liquid is washed with water, and separation of the reaction liquid and removal of a water layer are repeated; and finally, the solvent is distilled out from an oil layer.

It is known that depending on the ratio of a phenol derivative represented by the formula (1) and an epihalohydrin used in the above synthesis reaction, epoxy resins having different main ingredients in the component (A) are obtained. For example, in the case of using an excessive amount of an epihalohydrin with respect to a phenolic hydroxyl group of a phenol derivative, the component (A) is obtained which has as a main ingredient a trifunctional epoxy resin in which three phenolic hydroxyl groups in the formula (1) are all epoxidized; but along with a smaller amount of the epihalohydrin used with respect to the phenolic hydroxyl group, the content of polyfunctional epoxy resins having a high molecular weight increases, in which the phenolic hydroxyl groups of a plurality of the phenol derivatives bond with each other through the epihalohydrins, and residual phenolic hydroxyl groups are epoxidized.

A method of obtaining the component (A) having as a main ingredient such polyfunctional epoxy resins having a high molecular weight also includes, in addition to the above method of controlling the ratio of a phenol derivative and an epihalohydrin, a method in which a phenol derivative is further caused to react with the epoxy resin (A).

As the component (A) contained in the resin composition according to the present invention, the one can be used which has as a main ingredient the above trifunctional epoxy resin or the above polyfunctional epoxy resin having a high molecular weight, but it preferably contains as a main ingredient an epoxy resin represented by either the following formula (2) or (3). The areal ratio of the epoxy resin represented by the formula (2) to the epoxy resin represented by the formula (3) as calculated in terms of polystyrene based on measurement results of GPC (gel permeation chromatography), i.e. the ratio of an epoxy resin of the formula (2)/an epoxy resin of the formula (3) based on the GPC results, is more preferably in the range of 1 to 20, and still more preferably in the range of 1.1 to 12.

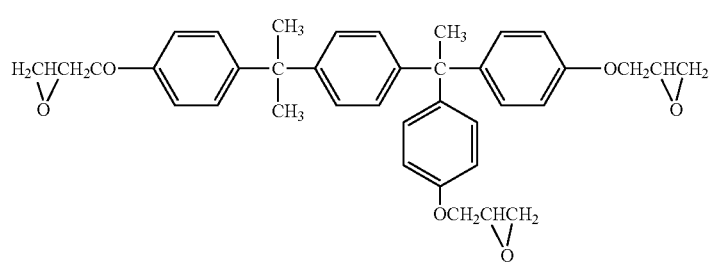

(2)

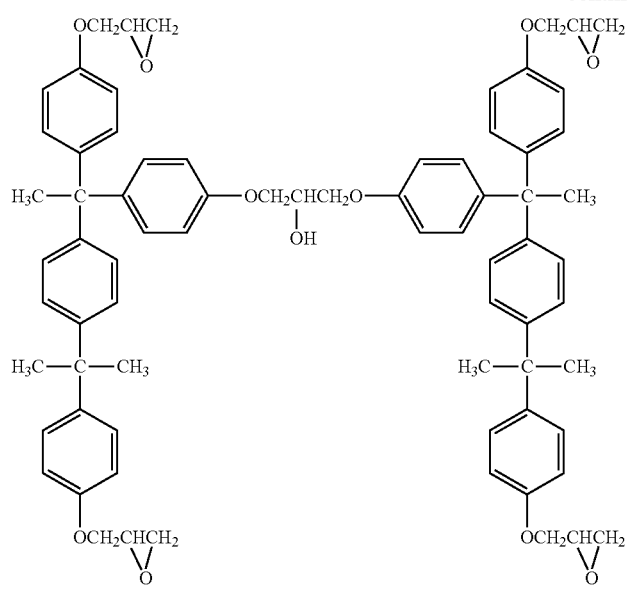

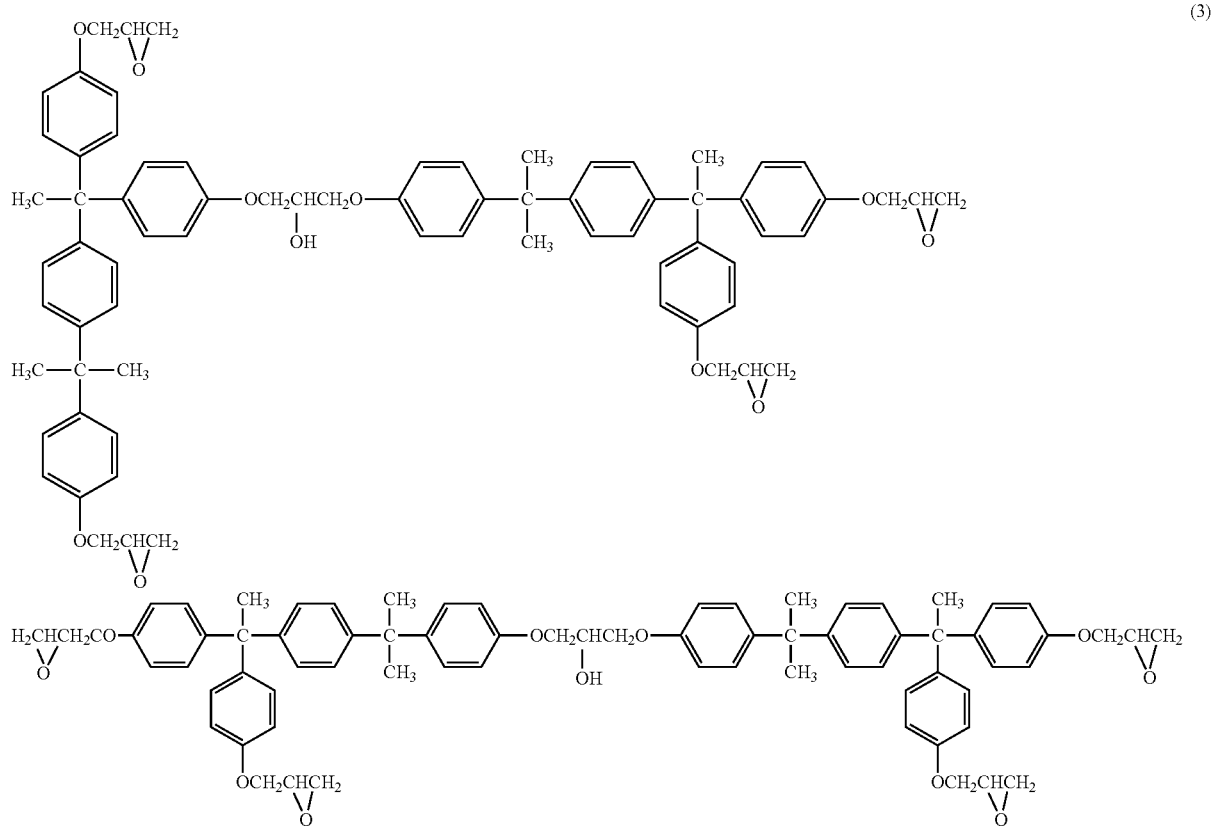

(3)

Specific examples of commercially available ones of the epoxy resin (A) include Techmore VG3101 (made by Printec Co., Ltd.) and NC-6000 (made by Nippon Kayaku Co., Ltd.).

The alkali-soluble resin (B) contained in the resin composition according to the present invention is not especially limited as long as being capable of imparting the resin composition with developability (solubility) to an alkali aqueous solution. However, as the alkali-soluble resin (B), it is preferred to use the one which itself exhibits little coloration in a sense of not impairing the high transparency of a cured product, which is an advantage of the present invention. Specific examples of the component (B) include phenol novolac resins, ortho-cresol novolac resins, copolymers of ethylenic unsaturated compounds such as acrylate esters, polyester resins synthesized from polyhydric alcohols and polybasic acid compounds, and reaction products of epoxy resins with monocarboxylic acids and polybasic acid anhydrides. It is preferred to use, as the component (B), compounds having one or more carboxyl groups in one molecule thereof, and more preferred to use resins obtained by reacting an epoxy resin (a) with a monocarboxylic acid (b) so as to prepare a reaction product and then subjecting the reaction product to a further reaction with a polybasic acid or an anhydride thereof (c), from the viewpoint of the solubility to an alkali aqueous solution.

Examples of the epoxy resin (a) used as a raw material of the alkali-soluble resin (B) include novolac epoxy resins, bisphenol epoxy resins, biphenyl epoxy resins, triphenylmethane epoxy resins, and phenolaralkyl epoxy resins. Specific examples of them include solid or liquid epoxy resins including: glycidyl etherified substances derived from polycondensates of bisphenol A, bisphenol F, bisphenol S, thiodiphenol, fluorene bisphenol, terpene diphenol, 4,4'-biphenol, 2,2'-biphenol, 3,3',5,5'-tetramethyl-[1,1'-biphenyl]-4,4'-diol, hydroquinone, resorcinol, naphthalenediol, tris-(4-hydroxyphenyl)methane, 1,1,2,2-tetrakis(4-hydroxyphenyl)ethane, or phenols (such as phenol, alkyl-substituted phenols, naphthol, alkyl-substituted naphthols, dihydroxybenzene, dihydroxynaphthalene, or the like) with formaldehyde, acetaldehyde, benzaldehyde, p-hydroxybenzaldehyde, o-hydroxybenzaldehyde, p-hydroxyacetophenone, o-hydroxyacetophenone, dicyclopentadiene, furfural, 4,4'-bis(chloromethyl)-1,1'-biphenyl, 4,4'-bis(methoxymethyl)-1,1'-biphenyl, 1,4-bis(chloromethyl)benzene, 1,4-bis(methoxymethyl)benzene, or the like, or modified substances thereof, or halogenated bisphenols such as tetrabromobisphenol A, and alcohols; and alicyclic epoxy resins, but are not limited thereto. However, as the epoxy resin (a), it is preferred to use an epoxy resin which itself exhibits little coloration, and especially preferred to use a bisphenol A epoxy resin or an epoxy resin having as a main ingredient the one represented by either one of the above formula (2) and (3), in a sense of not impairing such an advantage of the present invention that the cured product has high transparency.

Examples of the monocarboxylic acid (b) used as a raw material of the alkali-soluble resin (B) include ethylenic unsaturated monocarboxylic acids such as acrylic acid, methacrylic acid, crotonic acid, cinnamic acid, and an acrylic acid dimmer, polyhydroxy-containing monocarboxylic acids such as dimethylolpropionic acid, dimethylolacetic acid, dimethylolbutyric acid, dimethylolvaleric acid, and dimethylolcaproic acid, and monohydroxy-containing monocarboxylic acids such as hydroxypivalic acid and p-hydroxybenzoic acid.

Examples of the polybasic acid or anhydride thereof (c) used as a raw material of the alkali-soluble resin (B) include polybasic acids such as succinic acid, maleic acid, phthalic acid, tetrahydrophthalic acid, hexahydrophthalic acid, methylhexahydrophthalic acid, methylendomethylenetetrahydrophthalic acid, trimellitic acid, and pyromellitic acid, and anhydrides thereof.

In the reaction of the epoxy resin (a) with the monocarboxylic acid (b), preferably about 0.1 to 1.5 equivalent of the monocarboxylic acid (b) is caused to react with 1 equivalent of the epoxy resin (a). In the reaction time, a solvent, such as methyl ethyl ketone, methyl isobutyl ketone, cyclopentanone, ethyl cellosolve acetate, butyl cellosolve acetate, carbitol acetate, diethylene glycol dimethyl ether, or solvent naphtha, is preferably used as a diluent. In order to promote the reaction, further a catalyst (for example, triethylamine, benzyldimethylamine, tetramethylammonium chloride, methyltriethylammonium chloride, triphenylstibine, or triphenylphosphine) is preferably used; and the amount of the catalyst used is preferably 0.01 to 10 wt %, and especially preferably 0.05 to 5 wt %, with respect to a reaction raw material mixture. In order to prevent the polymerization during the reaction, a polymerization inhibitor (for example, methoquinone, hydroquinone, dibutylhydroxytoluene, or phenothiazine) is preferably used; and the amount thereof used is preferably 0.01 to 2 wt %, and especially preferably 0.05 to 1 wt %, with respect to a reaction raw material mixture. The reaction temperature is usually 60 to 150° C., and the reaction time is usually 5 to 50 hours.

Preferably, 0.05 to 1.00 equivalent of the polybasic acid or anhydride thereof (c) per equivalent of a hydroxyl group in a reaction product of the epoxy resin (a) with the monocarboxylic acid (b) is caused to react (esterified) with the reaction product to thereby obtain the alkali-soluble resin (B) from the epoxy resin (a), the monocarboxylic acid (b), and the polybasic acid or anhydride thereof (c). The reaction temperature may be 60 to 160° C.

The acid value (mgKOH/g) of the alkali-soluble resin (B) thus obtained is preferably 30 to 160, and especially preferably 50 to 150. The term acid value used herein is a value measured according to JIS K-2501.

The photocationic polymerization initiator (C) contained in the resin composition according to the present invention means a chemical species generating a cationic species by irradiation with active energy rays, which can be used with no limitation as long as the initiator has enough performance to cure the epoxy resin (A). Examples of usable ones of the photocationic polymerization initiator (C) include aromatic iodonium complex salts and aromatic sulfonium complex salts. Among them, specific examples of the aromatic iodonium complex salts include diphenyliodonium tetrakis(pentafluorophenyl)borate, diphenyliodonium hexafluorophosphate, diphenyliodonium hexafluoroantimonate, di(4-nonylphenyl)iodonium hexafluorophosphate, tolylcumyliodonium tetrakis(pentafluorophenyl)borate (made by Rhodia Chemie N.V., trade name: Rhodosil Photoinitiator 2074), and di(4-tertiary butyl)iodonium tris(trifluoromethanesulfonyl)methanide (made by BASF Japan Ltd., trade name: CGI BBIC C1).

Specific suitable examples of the aromatic sulfonium complex salt are 4-(phenylthio)phenyldiphenylsulfonium hexafluoroantimonate (made by San-Apro Ltd., trade name: CPI-101A), 4-(phenylthio)phenyldiphenylsulfonium tris(pentafluoroethyl)trifluorophosphate (made by San-Apro Ltd., trade name: CPI-210S), 4-{4-(2-chlorobenzoyl)phenylthio}phenylbis(4-fluorophenyl)sulfonium hexafluoroantimonate (made by Adeka Corp., trade name: SP-172), a mixture of aromatic sulfonium hexafluoroantimonates containing 4-(phenylthio)phenyldiphenylsulfonium hexafluoroantimonate (made by Dow Chemical Co., trade name: UVI-6976), triphenylsulfonium tris(trifluoromethanesulfonyl)methanide (made by BASF Japan Ltd., trade name: CGI TPS C1), tris[4-(4-acetylphenylsulfanyl)phenyl]sulfonium tris[(trifluoromethyl)sulfonyl]methanide (made by BASF Japan Ltd., trade name: GSID26-1), and tris[4-(4-acetylphenyl)thiophenyl]sulfonium tetrakis(pentafluorophenyl)borate (made by BASF Japan Ltd., trade name: PAG-290).

Among these examples of the component (C), 4-(phenylthio)phenyldiphenylsulfonium complex salts are preferable because of hardly coloring the resin in the heating time and being excellent in acid generation capability when being irradiated with light.

Then, the blend proportion of the components in the negative photosensitive resin composition according to the present invention will be described.

The resin composition according to the present invention, when the total of the component (A), the component (B), and the component (C) is taken as 100 mass %, usually contains 10 to 90 mass %, preferably 10 to 80 mass %, and more preferably 20 to 50 mass % of the component (A); 10 to 90 mass %, preferably 10 to 80 mass %, and more preferably 50 to 80 mass % of the component (B); and 0.1 to 15 mass %, and preferably 1 to 10 mass % of the component (C). Because the photocationic polymerization initiator (C) used in the resin composition according to the present invention has a high molar absorption coefficient at wavelengths of 300 to 380 nm, it is especially preferred to use an optimum amount of this component depending on the thickness of a film formed from the resin composition.

For the purpose of improving the performance of patterns, the reactivity of resists, the physical properties of cured films, and the like, to the negative photosensitive resin composition according to the present invention, a reactive epoxy monomer (D) (hereinafter, referred to simply as "component (D)" in some cases) having miscibility with the component (A) or the component (B) may be added. The component (D) used herein means a compound which has a relatively low molecular weight, is liquid or semisolid at room temperature, and has an epoxy group. Specific examples thereof include diethylene glycol diglycidyl ether, hexanediol diglycidyl ether, dimethylolpropane diglycidyl ether, polypropylene glycol diglycidyl ether (made by Adeka Corp., ED506), trimethylolpropane triglycidyl ether (made by Adeka Corp. ED505), trimethylolpropane triglycidyl ether (low chlorine type, made by Nagase ChemteX Corp., EX321L), pentaerythritol tetraglycidyl ether, bisphenol A diglycidyl ether, bisphenol F diglycidyl ether, and 3,4-epoxycyclohexenylmethyl-3',4'-epoxycyclohexene carboxylate (Daicel Chemical Industries, Ltd., Celloxide 2021P). These can be used singly or as a mixture of two or more. In the case where the component (D) is liquid, and if the component is blended in the resin composition in an amount of more than 20 mass % based on the total amount of the resin composition, a film after solvent removal causes stickiness and is easy to generate mask sticking, which is unsuitable. It is preferred from this perspective that the blend proportion of the component (D) in the resin composition according to the present invention is 20 mass % or less with respect to the total of the component (A), the component (B), and the component (C).

In order to decrease the viscosity of the negative photosensitive resin composition according to the present invention and to improve the coatability thereof, a solvent (E) can be used in the resin composition. The solvent may be an organic solvent usually used for inks, coatings, and the like, and is not especially limited as long as being capable of dissolving each of the components constituting the resin composition. Specific examples of the solvent (E) include ketones such as acetone, ethyl methyl ketone, cyclohexanone, and cyclopentanone, aromatic hydrocarbons such as toluene, xylene, and tetramethylbenzene, glycol ethers such as dipropylene glycol dimethyl ether and dipropylene glycol diethyl ether, esters such as ethyl acetate, butyl acetate, butyl cellosolve acetate, carbitol acetate, propylene glycol monomethyl ether acetate, and γ-butyrolactone, alcohols such as methanol, ethanol, cellosolve, and methyl cellosolve, aliphatic hydrocarbons such as octane and decane, and petroleum-based solvents such as petroleum ethers, petroleum naphthas, hydrogenated petroleum naphthas, and solvent naphthas.

These solvents can be used singly or as a mixture of two or more. The component (E) of solvent is added for the purpose of adjusting the film thickness and the coatability when the resin composition is applied on a base material. The amount of the solvent used to properly keep the solubility of the main ingredient, the volatility of components, the liquid viscosity of the composition, and the like is preferably 95 mass % or less, and especially preferably 10 to 90 mass % in the resin composition.

For the purpose of improving the adherence of the negative photosensitive resin composition according to the present invention to a substrate, an adherence imparting agent having miscibility with the component (A) and the component (B) may further be added to the resin composition. As the adherence imparting agent, a coupling agent such as a silane coupling agent or a titanium coupling agent can be used. Among them, a silane coupling agent is preferably used.

Specific examples of the silane coupling agent include 3-chloropropyltrimethoxysilane, vinyltrichlorosilane, vinyltriethoxysilane, vinyltrimethoxysilane, vinyltris(2-methoxyethoxy)silane, 3-methacryloxypropyltrimethoxysilane, 2-(3,4-epoxycyclohexyl)ethyltrimethoxysilane, 3-glycidoxypropyltrimethoxysilane, 3-mercaptopropyltrimethoxysilane, 3-aminopropyltriethoxysilane, N-2-(aminoethyl)-3-aminopropyltrimethoxysilane, and 3-ureidopropyltriethoxysilane. These adherence imparting agents can be used singly or in a combination of two or more.

In the case where the adherence imparting agent has no reactivity with the main ingredient, because the adherence imparting agent remains as it is in a cured product except acting at the interface with a base material, an excessive amount of the adherence imparting agent may have a risk of causing adverse effects such as deterioration of physical properties. It is appropriate to use the adherence imparting agent in an amount to cause no adverse effect, because even a small amount thereof can exhibit the desired effect depending on the type of the base material. The amount is preferably 15 mass % or less, and especially preferably 5 mass % or less in the resin composition.

The negative photosensitive resin composition according to the present invention may further comprise a sensitizer which functions to absorb ultraviolet rays and supply the absorbed light energy to the photocationic polymerization initiator. As the sensitizer, thioxanthones and anthracene compounds having alkoxy groups at 9-position and 10-position of anthracene (9,10-dialkoxyanthracene derivatives) may be preferably used, for example. Examples of the alkoxy group include C1 to C4 alkoxy groups such as a methoxy group, an ethoxy group, a propoxy group, and a butoxy group. The 9,10-dialkoxyanthracene derivatives may further have a substituent(s). Examples of the substituent include halogen atoms such as a fluorine atom, a chlorine atom, a bromine atom, and an iodine atom, C1 to C4 alkyl groups such as a methyl group, an ethyl group, and a propyl group, alkyl sulfonate ester groups and alkyl carboxylate ester groups. Examples of the alkyl group in the alkyl sulfonate ester groups or the alkyl carboxylate ester groups include C1 to C4 alkyls such as methyl, ethyl, and propyl. The substitution position of these substituents is preferably 2-position.

Specific examples of the thioxanthones include 2,4-dimethylthioxanthone, 2,4-diethylthioxanthone, 2-chlorothioxanthone, and 2,4-diisopropylthioxanthone. Among them, 2,4-diethylthioxanthone (trade name: Kayacure DETX-S, made by Nippon Kayaku Co., Ltd.) and 2-isopropylthioxanthone are preferred.

Examples of the 9,10-dialkoxyanthracene derivatives include 9,10-dimethoxyanthracene, 9,10-diethoxyanthracene, 9,10-dipropoxyanthracene, 9,10-dibutoxyanthracene, 9,10-dimethoxy-2-ethylanthracene, 9,10-diethoxy-2-ethylanthracene, 9,10-dipropoxy-2-ethylanthracene, 9,10-dimethoxy-2-chloroanthracene, 9,10-dimethoxyanthracene-2-sulfonic acid methyl ester, 9,10-diethoxyanthracene-2-sulfonic acid methyl ester, and 9,10-dimethoxyanthracene-2-carboxylic acid methyl ester.

These sensitizers can be used singly or as a mixture of two or more. Among them, it is most preferred to use 2,4-diethylthioxanthone, 9,10-dimethoxy-2-ethylanthracene and/or 9,10-dibutoxyanthracene. Because the sensitizer component can exhibit the desired effect in a small amount, the proportion is preferably 30 mass % or less, and especially preferably 20 mass % or less with respect to the component (C) of photocationic polymerization initiator.

To the negative photosensitive resin composition according to the present invention, an ion catcher may be added for the purpose of reducing adverse effects by ions originated from the photocationic polymerization initiator (C). Specific examples of the ion catcher include alkoxyaluminiums such as trismethoxyaluminium, trisethoxyaluminium, trisisopropoxyaluminium, isopropoxydiethoxyaluminium, and trisbutoxyaluminium, phenoxyaluminiums such as trisphenoxyaluminium and trispara-methylphenoxyaluminium, and organoaluminum compounds such as trisacetoxyaluminium, trisstearatoaluminium, trisbutyratoaluminium, trispropionatoaluminium, trisacetylacetonatoaluminium, tristrifluoroacetylacenatoaluminium, trisethylacetoacetatoaluminium, diacetylacetonatodipivaloylmethanatoaluminum, and diisopropoxy(ethylacetoacetato)aluminum. The ion catcher can be used singly or in a combination of two or more. The amount may be 10 mass % or less with respect to the total of the component (A), the component (B), and the component (C).

The negative photosensitive resin composition according to the present invention may comprise, as required, various types of additives such as a thermoplastic resin, a coloring agent, a thickener, a defoaming agent and a leveling agent. Examples of the thermoplastic resin include polyether sulfones, polystyrenes, and polycarbonates. Examples of the coloring agent include Phthalocyanine Blue, Phthalocyanine Green, Iodine Green, Crystal Violet, titanium oxide, carbon black, and naphthalene black. Examples of the thickener include Orben, Benton, and montmorillonite. Examples of the defoaming agent include silicone-, fluorine-, and polymer-based defoaming agents. In the case of using these additives, the amounts thereof used are, for example, each about 0.1 to 30 mass % as a sort of measure in the resin composition according to the present invention, but can suitably be varied according to the use purposes.

In the case where the component (B) contained in the negative photosensitive resin composition according to the present invention has an ethylenic unsaturated double bond, a photoradical polymerization initiator can further be used concurrently with the photocationic polymerization initiator (C).

The negative photosensitive resin composition according to the present invention may comprise inorganic fillers such as barium sulfate, barium titanate, silicon oxide, amorphous silica, talc, clay, magnesium carbonate, calcium carbonate, aluminum oxide, aluminum hydroxide, and mica powder. The content of the inorganic fillers may be 0 to 60 mass % in the resin composition according to the present invention.

The negative photosensitive resin composition according to the present invention can be obtained only by mixing and stirring the component (A), the component (B), and the component (C), and optional components added according to needs by a usual method. As required, the composition may be obtained by dispersing and mixing by using a dispersing machine such as a dissolver, a homogenizer, or a three-roll mill. The components may further be filtered using a mesh, a membrane filter, or the like after the mixing.

The resin composition according to the present invention is used preferably in a liquid form. The liquid resin composition is applied, for example, on a metal substrate of silicon, aluminum, copper, ITO, or the like, a ceramic substrate of lithium tantalate, glass, silicon oxide, silicon nitride, or the like, or a substrate of polyimide, polyethylene terephthalate, or the like, in a thickness of 0.1 to 1,000 μm by using a spin coater or the like, and subjected to a heat treatment at 60 to 130° C. for about 5 to 60 min to remove the solvent to thereby form a layer of the resin composition on the substrate. A mask having a predetermined pattern is placed on the resin composition layer; and the resin composition layer is irradiated with ultraviolet rays, and subjected to a heat treatment at 50 to 130° C. for about 1 to 50 min; and thereafter, unexposed portions are developed under the conditions of room temperature to 50° C. and about 1 to 180 min by using a developing liquid to thereby form a pattern. Then, the resultant is subjected to a heat treatment at 130 to 250° C. to thereby obtain a cured product satisfying various properties. As the developing liquid, an alkaline aqueous solution of TMAH, sodium hydroxide, potassium hydroxide, sodium carbonate, sodium silicate, or the like can be used. An aqueous solution in which a water-soluble organic solvent such as methanol or ethanol, and a surfactant are added to the above alkaline aqueous solution may be used as the developing liquid. A development apparatus of a paddle type, a spray type, a shower type, or the like may be used for the development. As required, ultrasonic irradiation may be carried out. Preferred examples of the substrate in use of the resin composition according to the present invention include glass and ITO.

EXAMPLES

Hereinafter, the present invention will be described in more detail by way of the working examples, but these examples are only illustrations to suitably describe the present invention, and do not limit the present invention any more. Parts in Synthesis Examples and Examples each represent parts by mass.

Synthesis Example 1

Synthesis of an Epoxy Resin (A-1)

141 parts of TrisP-PA (a phenol derivative represented by the formula (1), made by Honshu Chemical Industry Co., Ltd.), 370 parts of epichlorohydrin, and 64 parts of methanol were added to a flask equipped with a stirrer, a reflux cooling tube, and a stirring apparatus under nitrogen purging, and dissolved under stirring and heated to 70° C. Then, 42 parts of sodium hydroxide flake was added thereto dividedly over 90 min, and subsequently allowed to react at 70° C. for 1 hour. After the completion of the reaction, the resultant was washed with water; and surplus epichlorohydrin, the solvent, and the like were distilled out from the oil layer at 140° C. under reduced pressure by using a rotary evaporator. 400 parts of methyl isobutyl ketone was added to and dissolved in the remaining material, and heated to 70° C. 10 parts of a 30% sodium hydroxide aqueous solution was added thereto under stirring, and it was then stirred for 1 hour. Thereafter, the liquid was washed with water until the washing water became neutral; and methyl isobutyl ketone and the like were distilled out from the obtained solution at 180° C. under reduced pressure by using a rotary evaporator to thereby obtain an epoxy resin (A-1) containing the epoxy resin of the above formula (2) as a main ingredient. The epoxy equivalent of the obtained epoxy resin was 205 g/eq, and the softening point thereof was 58.8° C. In this instance, the areal ratio of the epoxy resin represented by the formula (2) to the epoxy resin represented by the formula (3) (the epoxy resin of the formula (2)/the epoxy resin of the formula (3)) as calculated in terms of polystyrene based on measurement results by GPC (gel permeation chromatography) was about 10.

Synthesis Example 2

Synthesis of an Epoxy Resin (A-2)

An epoxy resin (A-2) was obtained as in Synthesis Example 1, except for altering the amount of epichlorohydrin to 185 parts. The epoxy equivalent of the obtained epoxy resin was 233 g/eq, and the softening point thereof was 70° C. The areal ratio of the epoxy resin represented by the formula (2) to the epoxy resin represented by the formula (3) (the epoxy resin of the formula (2)/the epoxy resin of the formula (3)) as calculated in terms of polystyrene based on measurement results by GPC (gel permeation chromatography) was about 3.

Synthesis Example 3

Synthesis of an Alkali-Soluble Resin (B-1)

330 parts of NER-1302 (made by Nippon Kayaku Co., Ltd., a bisphenol A epoxy resin, epoxy equivalent: 330 g/eq, softening point: 70° C.), 72.8 parts of acrylic acid, 1.7 parts of dibutylhydroxytoluene, 0.9 part of tetramethylammonium chloride, and 173 parts of methyl isobutyl ketone were charged in a flask equipped with a stirrer, a reflux cooling tube, and a stirring apparatus, and heated to 98° C. The reaction was carried out with the temperature maintained at 98° C. until the acid value of the reaction liquid (mgKOH/g, an acid value of a solid content in which the solvent was removed, hereinafter the same applies) became 3.0 or less, and the reaction liquid was cooled to 60° C. Then, 150 parts of tetrahydrophthalic anhydride and 64 parts of methyl isobutyl ketone were charged therein, and heated to 120° C.; the reaction was carried out with the temperature maintained at 120° C. until the acid value of the reaction liquid became 100, and washed with water; and thereafter, methyl isobutyl ketone, while being distilled out, was replaced by propylene glycol monomethyl ether acetate to thereby obtain an alkali-soluble resin (B-1).

Synthesis Example 4

Synthesis of an Alkali-Soluble Resin (B-2)

233 parts of the epoxy resin (A-2) synthesized in Synthesis Example 2, 72.8 parts of acrylic acid, 1.3 parts of dibutylhydroxytoluene, 0.7 part of tetramethylammonium chloride, and 145 parts of methyl isobutyl ketone were charged in a flask equipped with a stirrer, a reflux cooling tube, and a stirring apparatus, and heated to 98° C. The reaction was carried out with the temperature maintained at 98° C. until the acid value of the reaction liquid became 3.0 or less, and the reaction liquid was cooled to 60° C. Then, 152 parts of tetrahydrophthalic anhydride and 51 parts of methyl isobutyl ketone were charged, and heated to 120° C.; the reaction was carried out with the temperature maintained at 120° C. until the acid value of the reaction liquid became 122, and washed with water; and thereafter, methyl isobutyl ketone, while being distilled out, was replaced by propylene glycol monomethyl ether acetate to thereby obtain an alkali-soluble resin (B-2).

In the above Synthesis Examples, physical property values of the resins were measured by the following methods.
Epoxy equivalent: JIS K-7236
Softening point: JIS K-7234
Molecular weight: GPC (gel permeation chromatography)

Examples 1 to 9 and Comparative Example 1

Preparation of Negative Photosensitive Resin Compositions

Resin compositions for Invention and Control were obtained by stirring and mixing the components in a flask with a stirrer according to blending amounts filled in Table 1 at 60° C. for 1 hour.
(Patterning of the Negative Photosensitive Resin Compositions)

Each of the resin compositions of Examples 1 to 9 and Comparative Example 1 was applied on a substrate (glass or ITO) by a spin coater, and thereafter dried to thereby obtain a resin composition layer having a film thickness shown in Table 1 ("film thickness after coating" in Table 1 represents a film thickness after coating and drying). Each of the resin composition layers was pre-baked by a hot plate at 65° C. for 5 min and at 95° C. for 10 min. Thereafter, the resin composition layer was subjected to a pattern exposure (soft contact, i-line) using an i-line exposing apparatus (mask aligner, made by Ushio Inc.), subjected to an post-exposure baking at 95° C. for 6 min by a hot plate, and subjected to a development treatment at 23° C. for 5 min by an immersion method using a 2.38 mass % TMAH solution to thereby obtain a resin pattern cured on the substrate.
(Evaluation of Sensitivities of the Negative Photosensitive Resin Compositions)

In the above pattern exposure, an exposure amount in which the mask transfer accuracy became best was taken to be an optimum exposure amount, and the sensitivity of each of the resin compositions was evaluated. A smaller value of the optimum exposure amount is equivalent to a higher sensitivity. The results are shown in Table 1.
(Evaluation of Resolutions of the Negative Photosensitive Resin Compositions)

In the pattern exposure using the optimum exposure amount acquired in the above, the resolution was evaluated by using a photomask of 1 to 50 μm in line and space, and measuring the finest pattern width adhered to a substrate in a resist pattern resolved without any residue. The results are shown in Table 1.
(Evaluation of Transmittances of the Negative Photosensitive Resin Compositions)

The cured product (thickness: 40 μm) obtained in the above was subjected to a heat treatment in an air oven at 230° C. for 20 min, and thereafter, measured for the light transmittance (%) at a wavelength of 450 nm in the thickness direction by a spectrophotometer (made by JASCO Corp., V-650). The results are shown in Table 1.
(Heat Resistances of the Negative Photosensitive Resin Compositions)

The cured product subjected to the heat treatment in an air oven at 230° C. for 20 min was measured for the heat resistance at a temperature-rise rate of 20° C./min by using TG/DTA (made by Seiko Instruments Inc., TG/DTA 6200). The heat resistance was evaluated according to the following criterion. The results are shown in Table 1 below.
Criterion
○: The 1%-weight loss temperature was 250° C. or more.
X: The 1%-weight loss temperature was less than 250° C.

TABLE 1

| Blend Component | | Example 1 | 2 | 3 | 4 | 5 | 6 | 7 | 8 | 9 | Comparative Example 1 |
|---|---|---|---|---|---|---|---|---|---|---|---|
| Epoxy resin | (A-1) | 30 | 30 | | | | | | | | |
| | (A-2) | | | 40 | 40 | 40 | 40 | 40 | 40 | 40 | |
| | (A-3) | | | | | | | | | | 40 |
| Alkali-soluble resin | (B-1) | 70 | 70 | | | | | | | | |
| | (B-2) | | | 60 | 60 | 60 | 60 | 60 | 60 | 60 | 60 |
| Photocationic polymerization initiator | (C-1) | 8 | 8 | 4 | 4 | | | | | | 4 |
| | (C-2) | | | | | 4 | 4 | | | | |
| | (C-3) | | | | | | | 4 | | | |
| | (C-4) | | | | | | | | 4 | 4 | |
| Epoxy monomer | (D) | | 10 | | 10 | 10 | 10 | 10 | 10 | 10 | 10 |
| Solvent | (E) | 60 | 60 | 60 | 60 | 60 | 60 | 60 | 60 | 60 | 60 |
| Leveling agent | (F) | 0.2 | 0.2 | 0.2 | 0.2 | 0.2 | 0.2 | 0.2 | 0.2 | 0.2 | 0.2 |
| Coupling agent | (G) | 1.5 | 1.5 | 1.5 | 1.5 | 1.5 | 1.5 | 1.5 | 1.5 | 1.5 | 1.5 |
| Sensitizer | (H-1) | | | | | | 0.8 | 0.8 | 0.8 | | |
| | (H-2) | | | | | | | | | 0.8 | |
| Film thickness after coating | [μm] | 40 | 40 | 40 | 40 | 40 | 40 | 40 | 40 | 40 | 40 |
| Sensitivity (optimum exposure amount) | [mJ/cm$^2$] | 375 | 300 | 325 | 300 | 450 | 125 | 60 | 45 | 45 | 800 |
| Finest resolution line width | [μm] | 10 | 10 | 10 | 10 | 10 | 10 | 10 | 10 | 10 | 10 |
| Transmittance after heat treatment | [%] | 97 | 97 | 98 | 96 | 97 | 90 | 90 | 90 | 90 | 83 |
| 1% Weight loss temperature | [° C.] | ○ | ○ | ○ | ○ | ○ | ○ | ○ | ○ | ○ | ○ |

(A-1): The epoxy resin obtained in Synthesis Example 1
(A-2): The epoxy resin obtained in Synthesis Example 2
(A-3): EOCN-1020 (made by Nippon Kayaku Co., Ltd., an ortho-cresol novolac epoxy resin, epoxy equivalent: 197 g/eq, softening point: 64° C.)
(B-1): The alkali-soluble resin obtained in Synthesis Example 3
(B-2): The alkali-soluble resin obtained in Synthesis Example 4
(C-1): CPI-210S (made by Sun-Apro Ltd.)
(C-2): UVI-6976 (made by Dow Chemical Co.)
(C-3): OPPI (made by Hampford Research Products)
(C-4): BBI-103 (made by Midori Kagaku Co., Ltd.)
(D): Celloxide 2021P (made by Daicel Chemical Industries, Ltd.)
(E): Propylene glycol monomethyl ether acetate
(F): Megafac F-470 (made by DIC Corp.)
(G): S510 (made by Chisso Corp.)
(H-1): Anthracure UVS-1331 (made by Kawasaki Kasei Chemicals Ltd.)
(H-2): 9,10-Dimethoxy-2-ethylanthracene (made by Sigma-Aldrich Corp.)

INDUSTRIAL APPLICABILITY

The negative photosensitive resin composition according to the present invention is capable of being developed with an alkali and it is excellent in image resolution and sensitivity. Additionally, the cured product of the resin composition is excellent in thermal stability, chemical resistance, and solvent dissolvability, and moreover exhibits little coloration when heated. Therefore, the cured product is useful for the fields requiring transparency, such as display applications.

The invention claimed is:

1. A negative photosensitive resin composition, comprising: an epoxy resin (A) having two or more epoxy groups in one molecule thereof; an alkali-soluble resin (B); and a photocationic polymerization initiator (C), wherein the epoxy resin (A) is obtained by a reaction of a phenol derivative represented by the following formula (1):

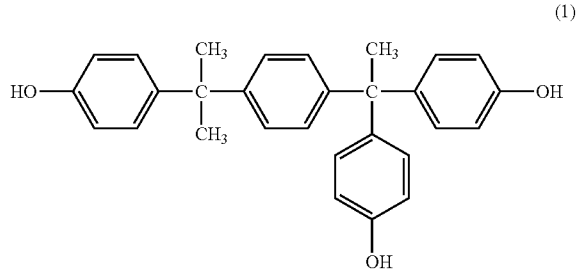 [SMILES: CC(C)(c1ccc(O)cc1)c1ccc(C(C)(c2ccc(O)cc2)c2ccc(O)cc2)cc1]

(1)

with an epihalohydrin.

2. The negative photosensitive resin composition according to claim 1, wherein the alkali-soluble resin (B) is an alkali-soluble resin having one or more carboxyl groups in one molecule thereof.

3. The negative photosensitive resin composition according to claim 2, wherein the alkali-soluble resin (B) is a resin obtained by reacting an epoxy resin (a) with a monocarboxylic acid (b) so as to prepare a reaction product; and then subjecting the reaction product to a further reaction with a polybasic acid or an anhydride thereof (c).

4. A cured product, being obtained by curing a negative photosensitive resin composition according to claim 3.

5. A cured product, being obtained by curing a negative photosensitive resin composition according to claim 2.

6. A cured product, being obtained by curing a negative photosensitive resin composition according to claim 1.

* * * * *